United States Patent
Yu et al.

(10) Patent No.: US 9,432,046 B1
(45) Date of Patent: Aug. 30, 2016

(54) SUCCESSIVE APPROXIMATION ANALOG-TO-DIGITAL CONVERTER

(71) Applicants: FARADAY TECHNOLOGY CORPORATION, Suzhou Industrial Park (CN); FARADAY TECHNOLOGY CORPORATION, Hsinchu (TW)

(72) Inventors: Guang-Wen Yu, Hsinchu (TW); Xing-Bo Ding, Hsinchu (TW); Min-Yuan Wu, Hsinchu (TW)

(73) Assignees: FARADAY TECHNOLOGY CORPORATION, Suzhou, Jiangsu Province (CN); Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 14/855,778

(22) Filed: Sep. 16, 2015

(30) Foreign Application Priority Data

Jun. 4, 2015 (CN) .......................... 2015 1 0306750

(51) Int. Cl.
*H03M 1/34* (2006.01)
*H03M 1/44* (2006.01)
*H03M 1/12* (2006.01)

(52) U.S. Cl.
CPC ........... *H03M 1/442* (2013.01); *H03M 1/1245* (2013.01)

(58) Field of Classification Search
CPC ....... H03M 1/442; H03M 1/38; H03M 1/403
USPC ........ 341/144, 155, 156, 150, 172, 163, 118
See application file for complete search history.

(56) References Cited

U.S. PATENT DOCUMENTS

| 7,233,276 | B1 * | 6/2007 | Huang | H03M 1/066 341/118 |
| --- | --- | --- | --- | --- |
| 8,059,022 | B2 * | 11/2011 | Cho | H03M 1/0682 341/144 |
| 8,659,461 | B1 | 2/2014 | Zhu et al. | |
| 2011/0285564 | A1 * | 11/2011 | Erdmann | H03M 1/0641 341/120 |
| 2012/0212357 | A1 * | 8/2012 | Haneda | H03M 1/066 341/110 |
| 2013/0169454 | A1 * | 7/2013 | Debnath | H03M 1/145 341/110 |
| 2014/0070972 | A1 * | 3/2014 | Morgado | H03M 3/426 341/143 |

* cited by examiner

*Primary Examiner* — Peguy Jean Pierre
(74) *Attorney, Agent, or Firm* — Winston Hsu; Scott Margo

(57) ABSTRACT

A successive approximation analog-to-digital converter includes a first capacitance bank, a second capacitance bank, a bridge capacitor, a switch set, a comparator and a successive approximation register logic circuit. The first capacitance bank is connected with a first node. The second capacitance bank is connected with a second node. The bridge capacitor is connected between the first node and the second node. Two first input terminals of the comparator are connected with the first node and the intermediate level, respectively. An output terminal of the comparator generates a comparing signal. The successive approximation register logic circuit receives the comparing signal, and generates the switching signal and a digital data signal. The switch set selectively provides one of a low reference level, a high reference level, an input level and an intermediate level to the first capacitance bank and the second capacitance bank.

18 Claims, 3 Drawing Sheets

SUCCESSIVE APPROXIMATION ANALOG-TO-DIGITAL CONVERTER

This application claims the benefit of People's Republic of China Application Serial No. 201510306750.6, filed Jun. 4, 2015, the subject matter of which is incorporated herein by reference.

FIELD OF THE INVENTION

The present invention relates to an analog-to-digital converter, and more particularly to a successive approximation analog-to-digital converter (SAR ADC).

BACKGROUND OF THE INVENTION

As is well known, an analog-to-digital converter (ADC) is used for converting the amplitude of an analog voltage (or current) into a digital value. Moreover, the analog-to-digital converter (ADC) has various circuitry configurations. According to the circuitry configurations, the analog-to-digital converters include a flash analog-to-digital converter (flash ADC), a pipeline analog-to-digital converter (pipeline ADC), a successive approximation analog-to-digital converter (SAR ADC), and so on.

Generally, the flash ADC is operated at the highest rate. However, the flash ADC has a complicated circuitry configuration and higher fabricating cost. The SAR ADC is operated at a slower rate. However, the SAR ADC has a simplified circuitry configuration and lower fabricating cost.

SUMMARY OF THE INVENTION

An embodiment of the present invention provides a successive approximation analog-to-digital converter. The successive approximation analog-to-digital converter includes a first capacitance bank, a second capacitance bank, a bridge capacitor, a switch set, a comparator and a successive approximation register logic circuit. The first capacitance bank includes j capacitors. First terminal of the j capacitors of the first capacitance bank are connected with a first node. The second capacitance bank includes (i+1) capacitors. First terminals of the (i+1) capacitors of the second capacitance bank are connected with a second node. The bridge capacitor is connected between the first node and the second node. The switch set includes j switch elements and (i+1) switch elements. First terminals of the j switch elements are respectively connected with second terminals of the j capacitors of the first capacitance bank. First terminals of the (i+1) switch elements are respectively connected with second terminals of the (i+1) capacitors of the second capacitance bank. The (i+j+1) switch elements are controlled according to a switching signal. Each of second terminals of the (i+j+1) switch elements of the switch set is selectively connected with one of a low reference level, a high reference level, an input level and an intermediate level. A first input terminal of the comparator is connected with the first node. A second input terminal of the comparator receives the intermediate level. An output terminal of the comparator generates a comparing signal. The successive approximation register logic circuit receives the comparing signal according to a clock signal, and generates the switching signal and a digital data signal. The switch set further includes a sampling switch element that is controlled according to the switching signal. A first terminal of the sampling switch element receives the intermediate level. A second terminal of the sampling switch element is connected with the first node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
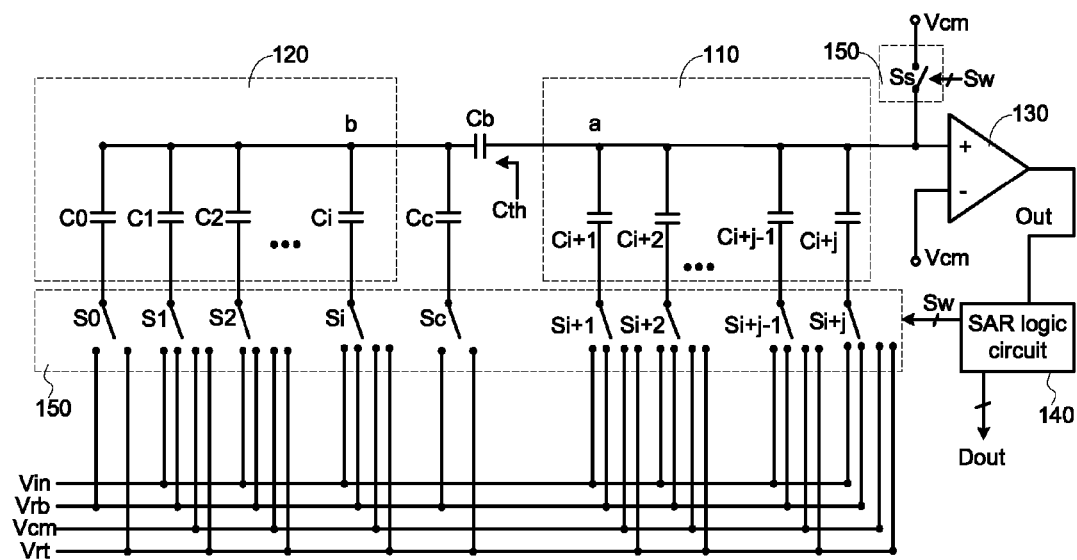
FIG. 1 is a schematic circuit diagram illustrating a successive approximation analog-to-digital converter according to an embodiment of the present invention.

FIG. 1 is a schematic circuit diagram illustrating a successive approximation analog-to-digital converter according to an embodiment of the present invention. As shown in FIG. 1, the successive approximation analog-to-digital converter 100 comprises a first capacitance bank 110, a second capacitance bank 120, a comparator 130, a successive approximation register logic circuit 140, a switch set 150 and a bridge capacitor Cb. Hereinafter, the successive approximation register logic circuit 140 is also referred as a SAR logic circuit.

In this embodiment, the second capacitance bank 120 comprises (i+1) capacitors C0~Ci. The first terminals of the capacitors C0~Ci are connected with a second node b. The second terminals of the capacitors C0~Ci are respectively connected with the first terminals of the switch elements S0~Si of the switch set 150. In the second capacitance bank 120, the capacitor C0 has a capacitance value c (i.e., a unit capacitance value), and the capacitance values of the other capacitors C1~Ci increase at a power of two. That is, $C_k = c \times 2^{(k-1)}$, wherein k is larger than or equal to 1, and k is smaller than or equal to i. In other words, the capacitance value of the capacitor C1 is equal to c, the capacitance value of the capacitor C2 is equal to 2c, . . . , and the capacitance value of the capacitor Ci is equal to $c \times 2^n$).

The first capacitance bank 110 comprises j capacitors C1+1~Ci+j. The first terminals of the capacitors Ci+1~Ci+j are connected with a first node a. The second terminals of the capacitors Ci+1~Ci+j are respectively connected with the first terminals of the switch elements Si+1~Si+j of the switch set 150. In the first capacitance bank 110, the capacitance values of the capacitors Ci+1~Ci+j increase at a power of two. That is, $C_{i+x} = c \times 2^{(x-1)}$, wherein x is larger than or equal to 1, and x is smaller than or equal to j. In other words, the capacitance value of the capacitor Ci+1 is equal to c, the capacitance value of the capacitor Ci+2 is equal to 2c, . . . , and the capacitance value of the capacitor Ci+j is equal to $c \times 2^{(j-1)}$.

The switch set 150 is connected with an input level Vin, a low reference level Vrb, a high reference level Vrt and an intermediate level Vcm. The difference between the high reference level Vrt and the low reference level Vrb is equal to a reference voltage Vref. The intermediate level Vcm is in the range between the low reference level Vrb and the high reference level Vrt, for example Vcm=(Vrb+Vrt)/2.

The switch set 150 is controlled according to a switching signal Sw. The second terminal of the switch element S0 is selectively connected with one of the low reference level Vrb and the high reference level Vrt. The second terminal of the each of the switch elements S1~Si and Si+1~Si+j is selectively connected with one of the input level Vin, the low reference level Vrb, the high reference level Vrt and the intermediate level Vcm. The switch set 150 further comprises a sampling switch element Ss. A first terminal of the sampling switch element Ss receives the intermediate level Vcm, and a second terminal of the sampling switch element Ss is connected with the first node a.

The bridge capacitor Cb is connected between the first node a and the second node b. A first input terminal (e.g., a positive input terminal) of the comparator 130 is connected with the first node a. A second input terminal (e.g., a negative input terminal) of the comparator 130 receives the intermediate level Vcm. An output terminal of the comparator 130 generates a comparing signal Out.

The SAR logic circuit 140 receives the comparing signal Out. According to the comparing signal Out, the switching signal Sw is successively changed by the SAR logic circuit 140. Consequently, the switched positions of the switch elements S0~Si and Si+1~Si+j of the switch set 150 are successively changed. After the switch elements S0~Si and Si+1~Si+j of the switch set 150 are successively changed, the SAR logic circuit 140 generates a corresponding digital data signal Dout.

In this embodiment, the successive approximation analog-to-digital converter 100 further comprises a compensation capacitor Cc and a compensation switch element Sc. The first terminal of the compensation capacitor Cc is connected with the second node b. The second terminal of the compensation capacitor Cc is connected with the first terminal of the compensation switch element Sc. Moreover, the compensation switch element Sc is controlled according to the switching signal Sw. Consequently, the second terminal of the compensation switch element Sc is selectively connected with one of the low reference level Vrb and the high reference level Vrt.

Moreover, the bridge capacitor Cb and the compensation capacitor Cc are specially designed. Consequently, after the second capacitance bank 120 and the compensation capacitor Cc are connected with each other in parallel and serially connected with the bridge capacitor Cb, the equivalent capacitor Cth has the capacitance value c.

Hereinafter, the operations of the successive approximation analog-to-digital converter will be illustrated by referring to i=4 and j=5.

Figure 2A:
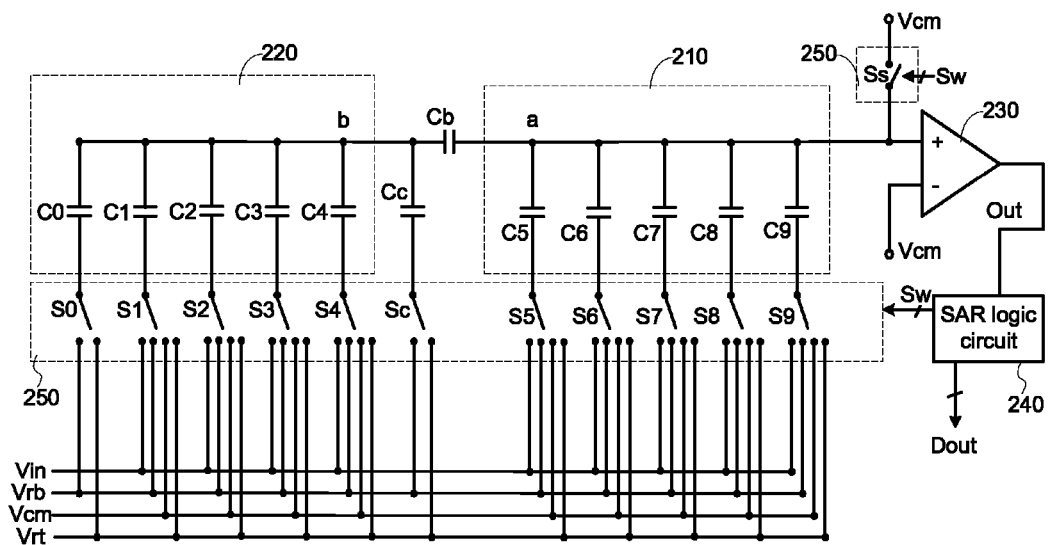
FIG. 2A is a schematic circuit diagram illustrating an example of the successive approximation analog-to-digital converter according to the embodiment of the present invention.

FIG. 2A is a schematic circuit diagram illustrating an example of the successive approximation analog-to-digital converter according to the embodiment of the present invention. As shown in FIG. 2A, the successive approximation analog-to-digital converter 200 comprises a first capacitance bank 210, a second capacitance bank 220, a comparator 230, a successive approximation register logic circuit 240, a switch set 250 and a bridge capacitor Cb. The successive approximation register logic circuit 240 is also referred as a SAR logic circuit. The successive approximation analog-to-digital converter 200 further comprises a compensation capacitor Cc and a compensation switch element Sc.

The second capacitance bank 220 comprises four capacitors C0~C4. The first terminals of the capacitors C0~C4 are connected with a second node b. The second terminals of the capacitors C0~C4 are respectively connected with the first terminals of the switch elements S0~S4 of the switch set 250. In the second capacitance bank 220, the capacitor C0 has the capacitance value c, the capacitor C1 has the capacitance value c, and the capacitance values of the other capacitors C2~C4 increase at a power of two. That is, the capacitance value of the capacitor C1 is equal to c, the capacitance value of the capacitor C2 is equal to 2c, the capacitance value of the capacitor C3 is equal to 4c, and the capacitance value of the capacitor C4 is equal to 8c.

The first capacitance bank 210 comprises five capacitors C5~C9. The first terminals of the capacitors C5~C9 are connected with a first node a. The second terminals of the capacitors C5~C9 are respectively connected with the first terminals of the switch elements S5~S9 of the switch set 250. In the first capacitance bank 210, the capacitor C5 has the capacitance value c, and the capacitance values of the other capacitors C6~C9 increase at a power of two. That is, the capacitance value of the capacitor C5 is equal to c, the capacitance value of the capacitor C6 is equal to 2c, the capacitance value of the capacitor C7 is equal to 4c, the capacitance value of the capacitor C8 is equal to 8c, and the capacitance value of the capacitor C9 is equal to 16c.

The switch set 150 is connected with an input level Vin, a low reference level Vrb, a high reference level Vrt and an intermediate level Vcm. The difference between the high reference level Vrt and the low reference level Vrb is equal to a reference voltage Vref. The intermediate level Vcm is in the range between the low reference level Vrb and the high reference level Vrt, for example Vcm=(Vrb+Vrt)/2.

The switch set 250 is controlled according to a switching signal Sw. The second terminal of the switch element S0 is selectively connected with one of the low reference level Vrb and the high reference level Vrt. The second terminal of the each of the switch elements S1~S9 is selectively connected with one of the input level Vin, the low reference level Vrb, the high reference level Vrt and the intermediate level Vcm. The switch set 250 further comprises a sampling switch element Ss. A first terminal of the sampling switch element Ss receives the intermediate level Vcm, and a second terminal of the sampling switch element Ss is connected with the first node a. Moreover, the compensation switch element Sc is also controlled according to the switching signal Sw. Consequently, the second terminal of the compensation switch element Sc is selectively connected with one of the low reference level Vrb and the high reference level Vrt.

The bridge capacitor Cb is connected between the first node a and the second node b. A first input terminal (e.g., a positive input terminal) of the comparator 230 is connected with the first node a. A second input terminal (e.g., a negative input terminal) of the comparator 230 receives the intermediate level Vcm. An output terminal of the comparator 230 generates a comparing signal Out.

The SAR logic circuit 240 receives the comparing signal Out. According to the comparing signal Out, the switching signal Sw is successively changed by the SAR logic circuit 240. Consequently, the switched positions of the switch elements S0~S9 of the switch set 250 are successively changed. After the switch elements S0~S9 of the switch set 250 are successively changed, the SAR logic circuit 240 generates a corresponding digital data signal Dout.

Figure 2B:
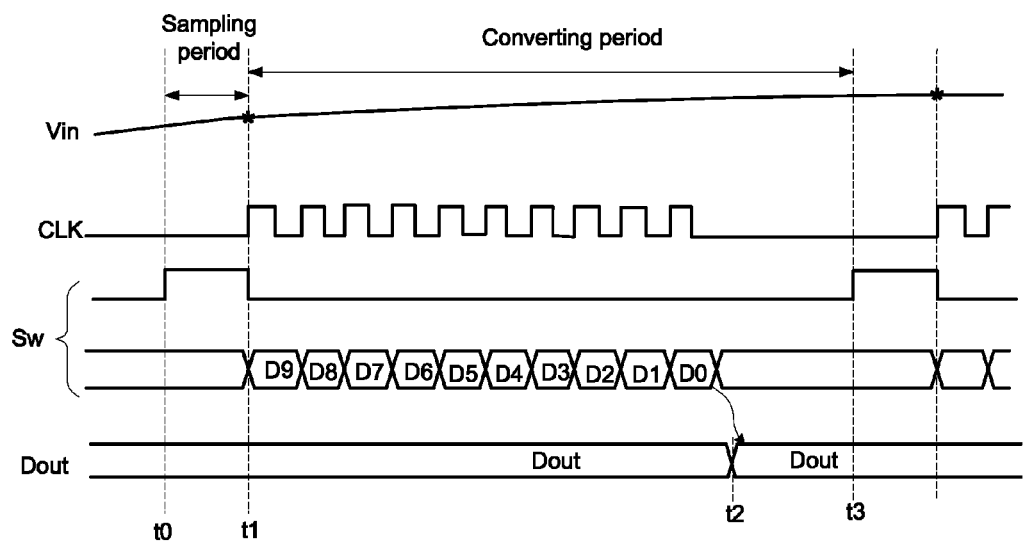
FIG. 2B is a schematic timing waveform diagram illustrating the signals associated with the SAR logic circuit of the successive approximation analog-to-digital converter as shown in FIG. 2A.

FIG. 2B is a schematic timing waveform diagram illustrating the signals associated with the SAR logic circuit of the successive approximation analog-to-digital converter as shown in FIG. 2A.

In a sampling period between the time point t0 and the time point t11, the sampling switch Ss is turned on to receive the intermediate level Vcm, the switch elements S1~S9 are connected with the input level Vin, and the switch element S0 and the compensation switch element Sc are connected with the low reference level Vrb. Consequently, at the time point t1, the voltage value of the input level Vin is sampled to the capacitors C1~C9.

After the sampling period is ended (i.e., at the time point t1), the sampling switch Ss is tuned off and not connected with the intermediate level Vcm. Moreover, the switch elements S1~S9 are connected with the intermediate level Vcm, and the switch element S0 and the compensation switch element Sc are connected with the low reference level Vrb or the high reference level Vrt according to the practical requirements.

In a converting period between the time point t1 and the time point t3, at least 10 (=i+j+1) clock cycles are used as the comparing cycles. In each comparing cycle, the comparator 230 compares the voltage of the first node a with the intermediate level Vcm and generates a comparing signal Out. According to the comparing signal Out, the switching signal Sw is successively changed by the SAR logic circuit 240 and then the comparing operation is done in the next comparing cycle. Moreover, according to the switching signal Sw, the switch elements S1~S9 of the switch set 250 are successively changed from the highest-numbered switch element S9 to the lowest-numbered switch element S1. That is, in each comparing cycle, a switched position of one switch element is changed according to the switching signal Sw, and the comparing signal Out from the comparator 230 is correspondingly changed.

That is, in a converting period between the time point t1 and the time point t3, the SAR logic circuit 240 receives the comparing signal Out according to a clock signal CLK and successively change the switching signal Sw in order to control the switch elements S1~S9. In other words, by changing the logic levels of the bits D1~D9, the switched position of the switch elements S9~S1 are controlled accordingly.

Firstly, in the first comparing cycle, the comparator 230 generates the comparing signal Out according to the result of comparing the voltage of the first node a with the intermediate level Vcm. Consequently, the logic level of the most significant bit (MSB), i.e., D9, of the digital data signal Dout is determined.

For example, if the voltage of the first node a is lower than the intermediate level Vcm, the comparing signal Out generates a first logic level (e.g., logic level "1"), and the logic level of the most significant bit (MSB), i.e., D9, of the digital data signal Dout is determined as "1". Then, the switching signal Sw is changed, and the highest-numbered switch element S9 is switched to the high reference level Vrt according to the switching signal Sw. Whereas, if the voltage of the first node a is higher than the intermediate level Vcm, the comparing signal Out generates a second logic level (e.g., logic level "0"), and the logic level of the most significant bit (MSB), i.e., D9, of the digital data signal Dout is determined as "0". Then, the switching signal Sw is changed, and the highest-numbered switch element S9 is switched to the low reference level Vrb according to the switching signal Sw.

The operations of the successive approximation analog-to-digital converter in the subsequent comparing cycles are similar to those in the first comparing cycle. After the previous-numbered switch element Sx is switched to the determined level, the comparator 230 generates the comparing signal Out according to the result of comparing the voltage of the first node a with the intermediate level Vcm. Consequently, the logic level of the next bit Dx−1 of the digital data signal Dout is determined, and the next switch element Sx−1 is correspondingly controlled. In the embodiment of FIG. 2A, x is successively decreased from 9 to 1. If the voltage of the first node a is lower than the intermediate level Vcm, the comparing signal Out generates the first logic level (e.g., logic level "1"), and the logic level of the next bit of the digital data signal Dout is determined as "1". Then, the switching signal Sw is changed, and the next-numbered switch element is switched to the high reference level Vrt according to the switching signal Sw. Whereas, if the voltage of the first node a is higher than the intermediate level Vcm, the comparing signal Out generates a second logic level (e.g., logic level "0"), and the logic level of the next bit of the digital data signal Dout is determined as "0". Then, the switching signal Sw is changed, and the next-numbered switch element is switched to the low reference level Vrb according to the switching signal Sw.

After the switch element S1 is switched to the determined level, the comparator 230 generates the comparing signal Out according to the result of comparing the voltage of the first node a with the intermediate level Vcm. Consequently, the logic level of the least significant bit (LSB), i.e., D0, of the digital data signal Dout is determined.

After the switch elements S9~S1 are successively switched according to the clock signal CLK, the logic levels of the bits D9~D0 of the digital data signal Dout from the most significant bit (MSB) to the least significant bit (LSB) are successively acquired. Moreover, at the time point t2, the sampled digital data signal Dout is outputted.

From the above descriptions, the switch elements S9~S1 of the successive approximation analog-to-digital converter 200 are successively switched from the intermediate level Vcm to the high reference level Vrt or switched from the intermediate level Vcm to the low reference level Vrb. Since the voltage swing amount is only one half of the amplitude of the reference voltage Vref, the power consumption is reduced.

Hereinafter, another operating method of the successive approximation analog-to-digital converter 200 of FIG. 2A will be illustrated as follows.

Firstly, in the first comparing cycle, the comparator 230 generates the comparing signal Out according to the result of comparing the voltage of the first node a with the intermediate level Vcm. Consequently, the logic level of the most significant bit (MSB), i.e., D9, of the digital data signal Dout is determined.

For example, if the voltage of the first node a is lower than the intermediate level Vcm, the comparing signal Out generates a first logic level (e.g., logic level "1"), and the logic level of the most significant bit (MSB), i.e., D9, of the digital data signal Dout is determined as "1". Then, the switching signal Sw is changed, and the highest-numbered switch element S9 is switched to the high reference level Vrt according to the switching signal Sw. Whereas, if the voltage of the first node a is higher than the intermediate level Vcm, the comparing signal Out generates a second logic level (e.g., logic level "0"), and the logic level of the most significant bit (MSB), i.e., D9, of the digital data signal Dout is determined as "0". Then, the switching signal Sw is changed, and the highest-numbered switch element S9 is switched to the low reference level Vrb according to the switching signal Sw.

In case that the D9 of the digital data signal Dout is "1", the other switch elements S8~S1 are switched to the high reference level Vrt or the intermediate level Vcm according to the logic levels of the comparing signal Out in the subsequent comparing cycles. For example, after the previous-numbered switch element Sx is switched to the determined level, the comparator 230 generates the comparing signal Out according to the result of comparing the voltage of the first node a with the intermediate level Vcm. If the voltage of the first node a is lower than the intermediate level Vcm, the comparing signal Out generates the first logic level (e.g., logic level "1"), and the logic level of the next bit of the digital data signal Dout is determined as "1". Then, the switching signal Sw is changed, and the next-numbered switch element is switched to the high reference level Vrt according to the switching signal Sw. Whereas, if the voltage of the first node a is higher than the intermediate level Vcm, the comparing signal Out generates a second logic level (e.g., logic level "0"), and the logic level of the next bit of the digital data signal Dout is determined as "0". Then, the switching signal Sw is changed, and the next-numbered switch element is switched to the intermediate level Vcm according to the switching signal Sw. Similarly, x is successively decreased from 9 to 1.

In case that the D9 of the digital data signal Dout is "0", the other switch elements S8~S1 are switched to the low reference level Vrb or the intermediate level Vcm according to the logic levels of the comparing signal Out in the subsequent comparing cycles. For example, after the previous-numbered switch element Sx is switched to the determined level, the comparator 230 generates the comparing signal Out according to the result of comparing the voltage of the first node a with the intermediate level Vcm. If the voltage of the first node a is lower than the intermediate level Vcm, the comparing signal Out generates the first logic level (e.g., logic level "1"), and the logic level of the next bit of the digital data signal Dout is determined as "1". Then, the switching signal Sw is changed, and the next-numbered switch element is maintained at the intermediate level Vcm according to the switching signal Sw. Whereas, if the voltage of the first node a is higher than the intermediate level Vcm, the comparing signal Out generates a second logic level (e.g., logic level "0"), and the logic level of the next bit of the digital data signal Dout is determined as "0". Then, the switching signal Sw is changed, and the next-numbered switch element is switched to the low reference level Vrb according to the switching signal Sw. Similarly, x is successively decreased from 9 to 1.

After the switch element S1 is switched to the determined level, the comparator 230 generates the comparing signal Out according to the result of comparing the voltage of the first node a with the intermediate level Vcm. Consequently, the logic level of the least significant bit (LSB), i.e., D0, of the digital data signal Dout is determined.

In the above embodiment, the successive approximation analog-to-digital converter 200 comprises the first capacitance bank 210 and the second capacitance bank 220, and the first capacitance bank 210 and the second capacitance bank 220 are connected with each other through the bridge capacitor Cb. Consequently, the capacitance values of the capacitances can be reduced. That is, the layout size of the capacitor is reduced. In the successive approximation analog-to-digital converter 200 of FIG. 2A, i=4 and j=5. It is noted that the values of i and j are not restricted. As long as the value (j−i) is larger than or equal to 1, the converting performance is satisfied.

As mentioned above, the second terminal of each of the switch element S0 and the compensation switch element Sc is selectively connected with one of the low reference level Vrb and the high reference level Vrt. It is noted that numerous modifications and alterations may be made while retaining the teachings of the invention. For example, the second terminal of each of the switch element S0 and the compensation switch element Sc is selectively connected with one of the input level Vin, the low reference level Vrb, the high reference level Vrt and the intermediate level Vcm. However, each of the switch element S0 and the compensation switch element Sc is selectively connected with one of the low reference level Vrb and the high reference level Vrt according to the switching signal Sw.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A successive approximation analog-to-digital converter, comprising:

a first capacitance bank comprising j capacitors, wherein first terminal of the j capacitors of the first capacitance bank are connected with a first node;

a second capacitance bank comprising (i+1) capacitors, wherein first terminals of the (i+1) capacitors of the second capacitance bank are connected with a second node;

a bridge capacitor connected between the first node and the second node;

a switch set comprising a first group having j switch elements and a second group having (i+1) switch elements, wherein first terminals of the j switch elements of the first group are respectively connected with second terminals of the j capacitors of the first capacitance bank, and first terminals of the (i+1) switch elements of the second group are respectively connected with second terminals of the (i+1) capacitors of the second capacitance bank, wherein the (i+j+1) switch elements are controlled according to a switching signal, wherein each of second terminals of the j switch elements of the first group is selectively connected with one of a low reference level, a high reference level, an input level and an intermediate level, wherein each of second terminals of the (i+1) switch elements of the second group is selectively connected with one of the low reference level, the high reference level, the input level and the intermediate level;

a comparator, wherein a first input terminal of the comparator is connected with the first node, a second input terminal of the comparator directly receives the intermediate level, and an output terminal of the comparator generates a comparing signal; and a successive approximation register logic circuit receiving the comparing signal according to a clock signal, and generating the switching signal and a digital data signal;

wherein the switch set further comprises a sampling switch element that is controlled according to the switching signal, wherein a first terminal of the sampling switch element receives the intermediate level, and a second terminal of the sampling switch element is connected with the first node.

2. The successive approximation analog-to-digital converter as claimed in claim 1, wherein one of the (i+1) capacitors of the second capacitance bank has a unit capacitance value, and the other capacitors of the second capacitance bank have capacitance values that sequentially increase at a power of two from the unit capacitance value.

3. The successive approximation analog-to-digital converter as claimed in claim 2, wherein the j capacitors of the first capacitance bank have capacitance values that sequentially increase at a power of two from the unit capacitance value.

4. The successive approximation analog-to-digital converter as claimed in claim 2, wherein the successive approximation analog-to-digital converter further comprises a compensation capacitor, and the switch set further comprises a compensation switch element, wherein a first terminal of the compensation capacitor is connected with the second node, a first terminal of the compensation switch element is connected with a second terminal of the compensation capacitor, and a second terminal of the compensation switch element is selectively connected with one of the low reference level and the high reference level according to the switching signal.

5. The successive approximation analog-to-digital converter as claimed in claim 4, wherein an equivalent capacitor of the compensation capacitor, the second capacitance bank and the bridge capacitor has the unit capacitance value.

6. The successive approximation analog-to-digital converter as claimed in claim 2, wherein during a sampling period, the sampling switch element is connected with the intermediate level, and a specific switch element of the second group corresponding to a specific capacitor with the unit capacitance value of the second capacitance bank is switched to the low reference level, and the other (i+j) switch elements are connected with the input level.

7. The successive approximation analog-to-digital converter as claimed in claim 6, wherein when the sampling period is ended, the sampling switch element is not connected with the intermediate level, the specific switch element of the second group corresponding to the specific capacitor with the unit capacitance value of the second capacitance bank is switched to the low reference level or the high reference level, and the other (i+j) switch elements of the switch set are switched to the intermediate level.

8. The successive approximation analog-to-digital converter as claimed in claim 7, wherein after the sampling period and during a converting period, the switching signal is successively changed according to the comparing signal, wherein the (i+j) switch elements of the switch set are successively switched according to the switching signal, wherein after all of the (i+j) switch elements are switched, the digital data signal is generated.

9. The successive approximation analog-to-digital converter as claimed in claim 7, wherein the converting period contains (i+j+1) comparing cycles, and (i+j+1) bits of the digital data signal are successively generated in the (i+j+1) comparing cycles.

10. The successive approximation analog-to-digital converter as claimed in claim 9, wherein in a first comparing cycle of the (i+j+1) comparing cycles, the most significant bit of the digital data signal is generated by the comparator according to a result of comparing a voltage of the first node with the intermediate level, and an (i+j)-th switch element of the switch set is switched according to the switching signal.

11. The successive approximation analog-to-digital converter as claimed in claim 10, wherein if the intermediate level is higher than the voltage of the first node in the first comparing cycle, the most significant bit of the digital data signal has a first logic level, and the (i+j)-th switch element is switched to the high reference level, wherein if the intermediate level is lower than the voltage of the first node in the first comparing cycle, the most significant bit of the digital data signal has a second logic level, and the (i+j)-th switch element is switched to the low reference level.

12. The successive approximation analog-to-digital converter as claimed in claim 11, wherein in an m-th comparing cycle of the (i+j+1) comparing cycles, an (i+j+1−m)-th bit of the digital data signal is generated by the comparator according to a result of comparing a voltage of the first node with the intermediate level, and a (i+j+1−m)-th switch element of the switch set is switched according to the switching signal, wherein m is a positive integer in a range between 2 and (i+j).

13. The successive approximation analog-to-digital converter as claimed in claim 12, wherein if the intermediate level is higher than the voltage of the first node in the m-th comparing cycle, the (i+j+1−m)-th bit of the digital data signal has the first logic level, and the (i+j+1−m)-th switch element is switched to the high reference level, wherein if the intermediate level is lower than the voltage of the first node in the m-th comparing cycle, the (i+j+1−m)-th bit of the digital data signal has the second logic level, and the (i+j+1−m)-th switch element is switched to the low reference level.

14. The successive approximation analog-to-digital converter as claimed in claim 10, wherein if the most significant bit of the digital data signal has the first logic level and an (i+j+1−m)-th bit of the digital data signal is generated by the comparator in an m-th comparing cycle of the (i+j+1) comparing cycles according to a result of comparing a voltage of the first node with the intermediate level, a (i+j+1−m)-th switch element of the switch set is switched according to the switching signal, wherein m is a positive integer in a range between 2 and (i+j).

15. The successive approximation analog-to-digital converter as claimed in claim 14, wherein if the intermediate level is higher than the voltage of the first node in the m-th comparing cycle, the (i+j+1−m)-th bit of the digital data signal has the first logic level, and the (i+j+1−m)-th switch element is switched to the high reference level, wherein if the intermediate level is lower than the voltage of the first node in the m-th comparing cycle, the (i+j+1−m)-th bit of the digital data signal has the second logic level, and the (i+j+1−m)-th switch element is maintained at the intermediate level.

16. The successive approximation analog-to-digital converter as claimed in claim 10, wherein if the most significant bit of the digital data signal has the second logic level and an (i+j+1−m)-th bit of the digital data signal is generated by the comparator in an m-th comparing cycle of the (i+j+1) comparing cycles according to a result of comparing a voltage of the first node with the intermediate level, a (i+j+1−m)-th switch element of the switch set is switched according to the switching signal, wherein m is a positive integer in a range between 2 and (i+j).

17. The successive approximation analog-to-digital converter as claimed in claim 16, wherein if the intermediate level is higher than the voltage of the first node in the m-th comparing cycle, the (i+j+1−m)-th bit of the digital data signal has the first logic level, and the (i+j+1−m)-th switch element is maintained at the intermediate level, wherein if the intermediate level is lower than the voltage of the first node in the m-th comparing cycle, the (i+j+1−m)-th bit of the digital data signal has the second logic level, and the (i+j+1−m)-th switch element is switched to the low reference level.

18. The successive approximation analog-to-digital converter as claimed in claim 10, wherein if the intermediate level is higher than the voltage of the first node in the (i+j+1)-th comparing cycle of the (i+j+1) comparing cycles, the least significant bit of the digital data signal has the first logic level, wherein if the intermediate level is lower than the voltage of the first node in the (i+j+1)-th comparing cycle, the least significant bit of the digital data signal has the second logic level.

* * * * *